United States Patent [19]
Poulain et al.

[11] 4,445,130
[45] Apr. 24, 1984

[54] HETEROJUNCTION PHOTOTRANSISTOR CONSTRUCTED IN PLANAR TECHNOLOGY

[75] Inventors: Pierre Poulain; Baudouin de Cremoux; Pierre Hirtz, all of Paris, France

[73] Assignee: Thomson-CSF, Paris, France

[21] Appl. No.: 319,401

[22] Filed: Nov. 9, 1981

[30] Foreign Application Priority Data

Nov. 12, 1980 [FR] France ............... 80 24036

[51] Int. Cl.³ ............... H01L 27/14
[52] U.S. Cl. ............... 357/16; 357/30; 357/58; 357/68
[58] Field of Search ............... 357/30 B, 30 D, 30 E, 357/58, 30, 16, 68

[56] References Cited

U.S. PATENT DOCUMENTS 3,609,460  9/1971  Jones et al. ............... 357/68 X
3,990,096 11/1976  Namizaki et al. ............... 357/16 X
3,993,963 11/1976  Logan et al. ............... 357/16 X

FOREIGN PATENT DOCUMENTS 650131  4/1979  U.S.S.R. ............... 357/16

OTHER PUBLICATIONS

Electronics Letters, vol. 16, No. 1,3; Jan. 1980; Hitchin Herts (GB). K. Ankri et al: "Design and Evaluation of a Planar GaAlAs–GaAs Bipolar Transistor", pp. 41–42. *p. 41*.

Primary Examiner—Martin H. Edlow
Assistant Examiner—William Mintel
Attorney, Agent, or Firm—Oblon, Fisher, Spivak, McClelland & Maier

[57] ABSTRACT

A phototransistor in planar technology for optical fiber communications permitting an easy formation of the contact connection of the transistor base located within the intermediate layer of an npn stack as well as accurate localization of the pn junction. To this end, the upper semiconductor layer initially receives a first diffusion of doping impurity in a first region which penetrates into the lower layer to a slight extent and forms the base region. An impurity of opposite type is then implanted in a second region which is located within the first and forms the emitter region whilst the substrate constitutes the collector. The base and emitter connections are formed on the free face whilst the collector is connected on the substrate side.

5 Claims, 6 Drawing Figures

HETEROJUNCTION PHOTOTRANSISTOR CONSTRUCTED IN PLANAR TECHNOLOGY

BACKGROUND OF THE INVENTION

This invention relates to a heterojunction phototransistor constructed in accordance with the so-called "planar" technology as well as to a method of manufacture of this device.

DESCRIPTION OF THE PRIOR ART

It is known that phototransistors of the planar type are fabricated by successive steps of epitaxial growth on a crystalline substrate from semiconductor materials which belong:
either to a ternary system: Ga, Al, As;
or to a quaternary system: Ga, In, As, P.

In this technology, however, the following difficulties are encountered:

(1) electrical connection of the device with good quality of contact in the case of the intermediate layer cannot readily be established for the following reasons:
the location of said layer is less readily accessible than the end layers either through the substrate or through the free top face of the phototransistor;
the usual thickness of said layer in a heterojunction phototransistor is very small, namely of the order of one micron.

(2) the position of the pn junction is difficult to control with accuracy by reason of the possible diffusion of the dopant from one layer to the next during the epitaxial growth process. This is particularly true in the quaternary system, in an npn transistor, in the case of diffusion of the $p^+$ type impurity of the intermediate layer (base) which is liable to diffuse relatively far into the top layer (emitter), thus giving rise to a substantial reduction of the amplification coefficient of the phototransistor.

SUMMARY OF THE INVENTION

The aim of the invention is to remove these difficulties by adopting a novel structure and a method of fabrication which is adapted to this structure.

The phototransistor in accordance with the invention comprises:
a substrate constituted by a first semiconductor material heavily doped in a first conductivity type;
a first semiconductor layer constituted by a second semiconductor material having a forbidden band which is so determined as to absorb a radiation of predetermined wavelength;
a second semiconductor layer constituted by a third semiconductor material having a forbidden bandwidth which is greater than that of the second material.

Said phototransistor is distinguished by the fact that:
the first layer has a lower dopant concentration than the substrate but is of the same conductivity type in a first region in contact with the substrate and is of opposite conductivity type in a second region located further away from the substrate than the first and thus having a pn or np junction;
the second layer has a third region of the same conductivity type as the substrate and occupying the entire thickness of the second layer and a relatively small portion of its width, the third region being surrounded by a fourth region of opposite conductivity type which is joined to the second region of the first layer.

BRIEF DESCRIPTION OF THE DRAWINGS

These and other features of the invention will be more apparent upon consideration of the following description and accompanying drawings, wherein.

DESCRIPTION OF THE PREFERRED EMBODIMENTS

Figure 1:
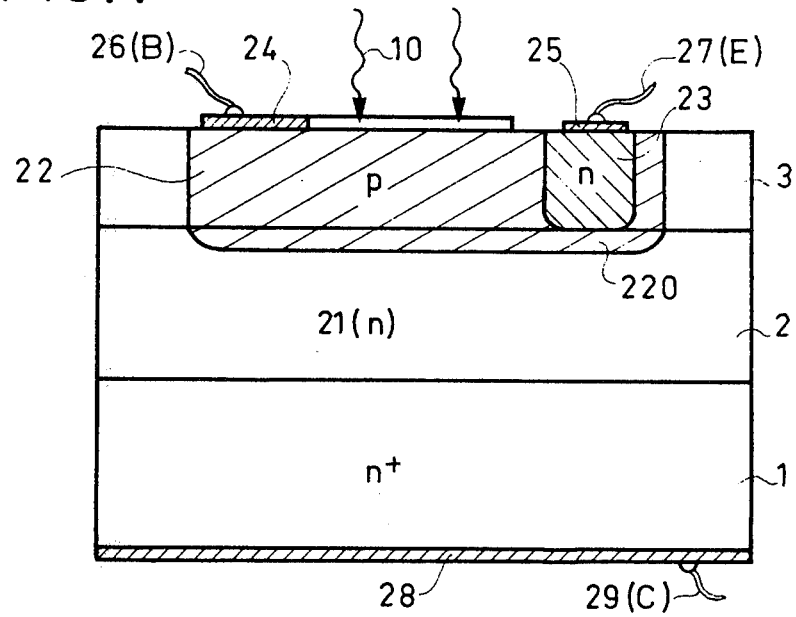
FIG. 1 is a schematic sectional view of a phototransistor in accordance with the invention.

The semiconductor block which forms the essential part of the phototransistor (shown in cross-section in FIG. 1) comprises:
a substrate 1 of monocrystalline semiconductor material such as, for example, $n^+$-type doped indium phosphide (concentration higher than or equal to $10^{17}$ at. $cm^{-3}$);
a first semiconductor layer 2 of material having a composition given by the formula:

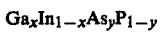

$Ga_xIn_{1-x}As_yP_{1-y}$ with: $0.05 \leq x \leq 0.47$ $0 < y < 1$ x and y being chosen within the above intervals while complying with the relation:
$x = 0.19y/(0.42 - 0.013 y)$ which is the condition to be satisfied in order to ensure that the monocrystalline lattice is compatible with that of the substrate 1 to within 1% in practice, initial doping of this layer (region 21) being carried out with a concentration of $10^{15}$ to $10^{17}$ at.$cm^{-3}$ of an n-type impurity.

a second semiconductor layer 3 of material having a composition given by the formula:

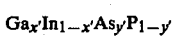

$Ga_{x'}In_{1-x'}As_{y'}P_{1-y'}$ where $x'$ and $y'$ are chosen within the same intervals as the first layer while complying with the same relation and also satisfying the condition:

$x' < x$ initial doping of said layer 3 being of unspecified type but nevertheless of sufficiently low concentration to avoid any interference with the following localized doping operations:
(a) in region 22, a diffusion of a p-type impurity with a view to obtaining a concentration of $10^{15}$ to $10^{17}$ at.$cm^{-3}$ which is pursued until the dopant penetrates into a part of the layer 2 (region 220);
(b) in region 23, implantation throughout the thickness of the layer 3, of an n-type impurity with a final concentration of $10^{15}$ to $10^{17}$ at.$cm^{-3}$.

The thicknesses are as follows:

in the case of the layer 2, a thickness of 1 to 10 microns but preferably within the range of 1.5 (in respect of a concentration of $10^{17}$ at.cm$^{-3}$) to 4 microns (in respect of $10^{15}$ at.cm$^{-3}$). The thickness of 1.5 micron is of minimum value in order to absorb practically the entire quantity of light in a single pass; it is true that this thickness could be of lower value in the example chosen without impairing photon absorption by reason of the fact that InP has the property of being transparent to light absorbed by the quaternary material. Successive reflections may then take place on the metallized face of the substrate and thus permit absorption of light during successive passes through the layer 2.

in the case of the layer 3, a thickness of 0.2 to 0.3 micron, the impurity implanted in the case of indium, gallium and arsenic phosphide being constituted by silicon ions accelerated by an ion implanter.

Figure 2:
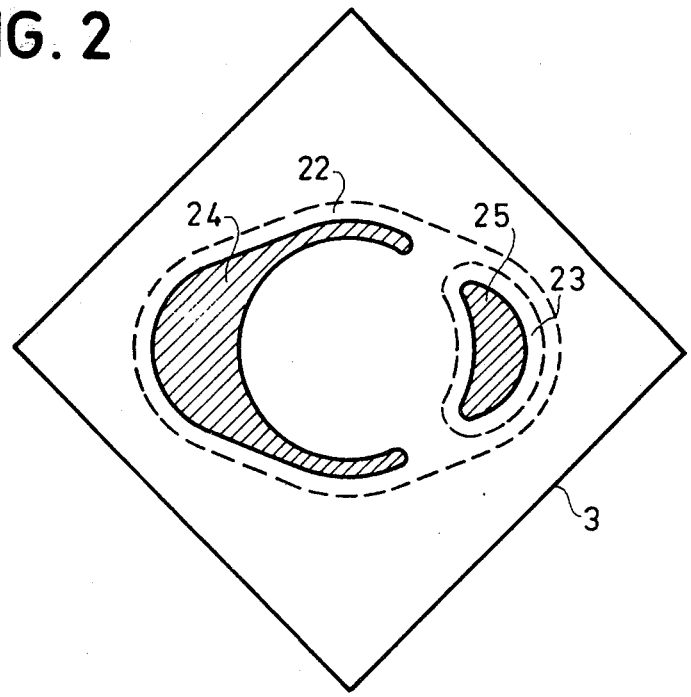
FIG. 2 is a top view of a phototransistor in accordance with the invention.

In order to complete the phototransistor, metallization deposits 24 and 25 are formed on the regions 22 and 23 respectively followed by a metallization layer 28 formed on the free face of the substrate. The metallization deposit 24 has a horseshoe shape as shown in FIG. 2 which is a top view of the phototransistor. Said deposit surrounds a zone 20 of circular shape which is located at the center and is intended to receive the light rays 10 (as shown in FIG. 1). Electrical connection leads 26(B), 27(E) and 29(C) are soldered to the metallization deposits (shown in FIG. 1) in order to constitute the accesses respectively to the base, to the emitter and to the collector of the phototransistor.

The operation of a phototransistor constructed in this manner is conventional: when the pn junction of the npn transistor is reverse-biased, the photons absorbed by the layer 2 give rise to electron-hole pairs and these latter generate the primary current which is amplified by transistor effect, thus giving rise to a collector current which is detected in order to measure the quantity of photons received.

Figure 6:
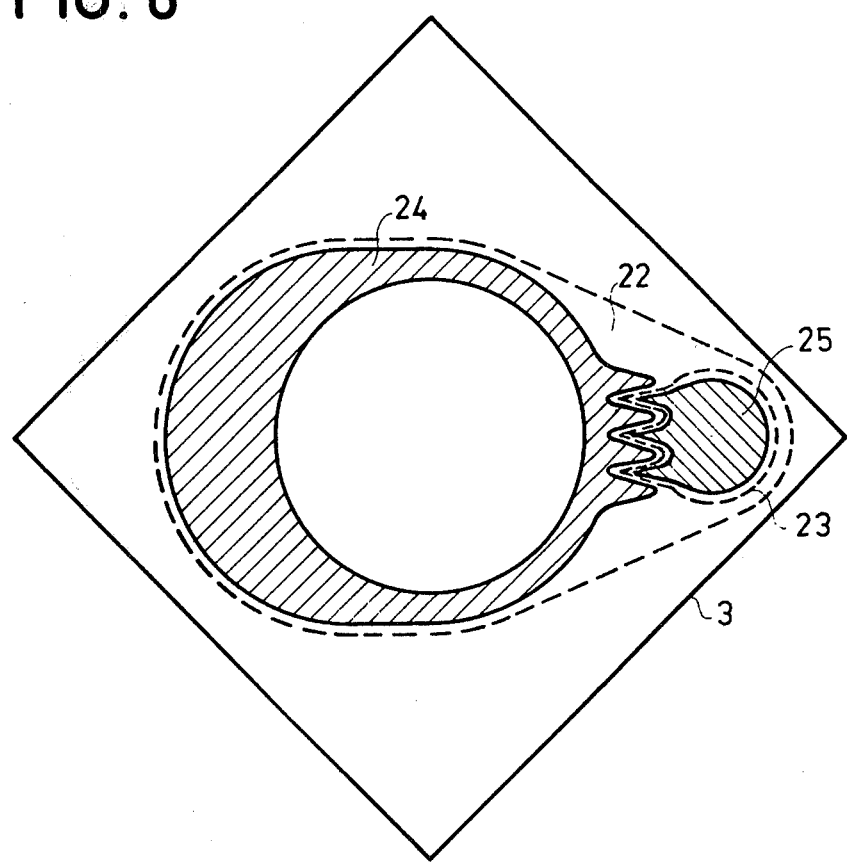
FIG. 6 is a top view of an alternative embodiment of the invention.

Noteworthy advantages of the invention include ease of fabrication of the base and emitter connections. Furthermore, in accordance with an alternative embodiment shown in FIG. 6, the regions 22 and 23 and the base and emitter metallization deposits 24 and 25 may be interdigitized, thus making it possible at very high frequency to reduce the lateral base resistance and to employ the phototransistor at the receiver in optical fiber telecommunications.

The method of fabrication involves the following steps:

(1) deposition of the layer 2 on the substrate 1 by epitaxial growth (in the liquid phase in the case of quaternary materials but epitaxy may also take place in the gas phase in the case of other materials), doping of the layer 2 being of the same conductivity type and of lower concentration than the substrate.

Figure 3:
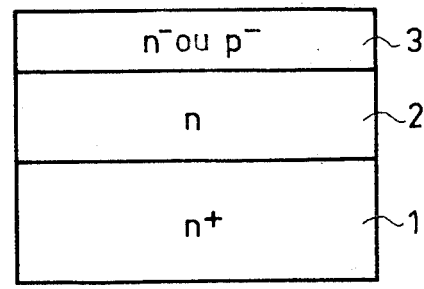
FIGS. 3 to 5 illustrate the steps involved in the fabrication of the phototransistor.

(2) deposition of the layer 3 on the layer 2 by the same method as in the preceding step, for example with the same doping and the same dopant concentration. The result obtained is shown in FIG. 3. The conductivity type could be opposite to that of the layer 2.

Figure 4:
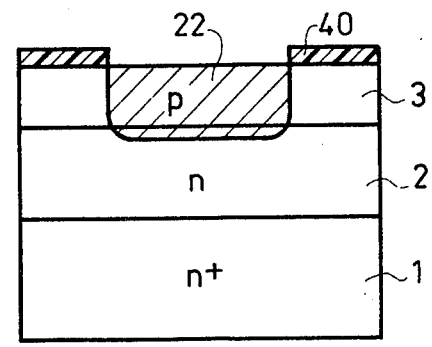

(3) formation of a dielectric mask 40 (shown in FIG. 4) by photoetching by means of silicon oxide, for example, the mask being provided with a central opening in order to constitute a diffusion window for the following step.

(4) diffusion of an acceptor impurity (Zn, Cd, Mg, Be for example in the case of an n-type substrate) and of an impurity of opposite type in the case of a p-type substrate so as to form the region 22 (shown in FIG. 4) which penetrates into the layer 2 to a depth of one or two microns (region 220).

(5) formation of a dielectric mask which is similar to the preceding (step 3) but defines a smaller opening than in the third step.

Figure 5:
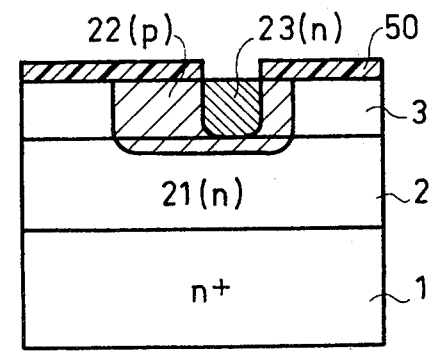

(6) formation of the region 23 (shown in FIG. 5) by implantation or diffusion of an impurity which is opposite in conductivity type to the impurity diffused in the fourth step.

(7) finishing of the phototransistor by deposition of the metallization layers 24, 25 and 28 followed by soldering of the connection leads 26, 27 and 29.

In an alternative form of the method (not shown in the drawings), a heavily doped monocrystalline layer of the same material as the substrate and of the same impurity type having a dopant concentration of $10^{17}$ to $10^{18}$ at.cm$^{-3}$ is formed directly on the substrate by epitaxial growth. This layer forms a buffer between the substrate 1 and the layer 2 in order to mask any possible defects of the crystal lattice of the substrate.

The invention can be carried out in the ternary system (Ga, Al, As, for example). If the substrate is of GaAs, the first layer is accordingly of material corresponding to the formula:

$$Ga_{1-z}Al_zAs$$

in which we have: $0 < z < 0.4$.

The thickness and concentration of dopant are chosen within ranges similar to those recommended in the case of the quaternary system.

The second layer is of material corresponding to the formula:

$$Ga_{1-z'}Al_{z'}As$$

in which we have: $z < z' < 1$.

By way of example, it is supposed that: $z' = z + 0.1$.

The method of fabrication is similar. However, epitaxial growth in the gas phase is easier to perform. In regard to n-type doping of region 23, this can readily be carried out by simple diffusion.

What is claimed is:

1. A heterojunction phototransistor of the type comprising:
a substrate constituted by a first semiconductor material heavily doped in a first conductivity type;
a first semiconductor layer constituted by a second semiconductor material having a forbidden gap which is so determined as to absorb a radiation of predetermined wavelength;
a second semiconductor layer constituted by a third semiconductor material having a forbidden band of greater width than that of said second material;
wherein said phototransistor has the following distinctive features:
the first layer has a lower dopant concentration than the substrate but is of the same conductivity type in a first region in contact with the substrate and is of opposite conductivity type in a second region located further away from the substrate than said first region and thus having a pn or np junction;

the second layer has a third region of the same conductivity type as the substrate and occupying the entire thickness of the second layer and a relatively small portion of its width, said third region being surrounded by a fourth region of opposite conductivity type which is joined to the second region of the first layer.

2. A phototransistor according to claim 1 wherein, the substrate being of monocrystalline indium phosphide, the first layer is of material having a composition given by the formula:

$$Ga_xIn_{1-x}As_yP_{1-y}$$

with:

$$0.05 \leq x \leq 0.47$$

$$0 < y < 1$$

x and y being chosen within these intervals so as to ensure that the crystal lattices of the material and of the substrate are compatible, and wherein the second layer is of material having a composition given by the formula:

$$Ga_{x'}In_{1-x'}As_{y'}P_{1-y'}$$

where x' and y' are selected within the same intervals as the parameters x and y with an additional condition which is:

$$x' < x.$$

3. A phototransistor according to claim 1 wherein, the substrate being of gallium arsenide, the first layer is of material having a composition given by the formula:

$$Ga_{1-z}Al_zAs$$

with:

$$0 \leq z \leq 0.4$$

the second layer being of material having a composition given by the formula:

$$Ga_{1-z'}Al_{z'}As$$

with:

$$z < z' \leq 1.$$

4. A phototransistor according to claim 1, wherein said phototransistor further comprises emitter, base and collector metallization deposits formed respectively on the faces of the semiconductor which provide access to the third region, to the fourth region and to the substrate.

5. A phototransistor according to claim 4, wherein the base metallization deposit is interdigitized with the emitter metallization deposit, the base metallization deposit being provided with an opening of circular shape through which the light to be detected is permitted to pass.

* * * * *